(12) United States Patent
Cox et al.

(10) Patent No.: US 7,295,283 B2
(45) Date of Patent: Nov. 13, 2007

(54) LITHOGRAPHIC APPARATUS AND DEVICE MANUFACTURING METHOD

(75) Inventors: Henrikus Herman Marie Cox, Eindhoven (NL); Petrus Marinus Christianus Maria Van Den Biggelaar, Nuenen (NL); Frits Van Der Meulen, Breda (NL); Franciscus Andreas Cornelis Johannes Spanjers, Oirschot (NL); Jan-Gerard Cornelis Van Der Toorn, Eindhoven (NL); Arend-Jan Migchelbrink, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 637 days.

(21) Appl. No.: 10/816,189

(22) Filed: Apr. 2, 2004

(65) Prior Publication Data

US 2005/0219481 A1 Oct. 6, 2005

(51) Int. Cl.
*G03B 27/52* (2006.01)
*G03B 27/42* (2006.01)

(52) U.S. Cl. .......................... 355/30; 355/53
(58) Field of Classification Search ............... 355/30, 355/53, 55, 67, 77; 250/548
See application file for complete search history.

(56) References Cited

U.S. PATENT DOCUMENTS

| | | | | |
|---|---|---|---|---|
| 3,573,975 A | 4/1971 | Dhaka et al. | ............... | 117/212 |
| 3,648,587 A | 3/1972 | Stevens | ............... | 95/44 |
| 4,346,164 A | 8/1982 | Tabarelli et al. | ............... | 430/311 |
| 4,390,273 A | 6/1983 | Loebach et al. | ............... | 355/125 |
| 4,396,705 A | 8/1983 | Akeyama et al. | ............... | 430/326 |
| 4,480,910 A | 11/1984 | Takanashi et al. | ............... | 355/30 |
| 4,509,852 A | 4/1985 | Tabarelli et al. | ............... | 355/30 |
| 5,040,020 A | 8/1991 | Rauschenbach et al. | ............... | 355/53 |
| 5,121,256 A | 6/1992 | Corle et al. | ............... | 359/684 |
| 5,610,683 A * | 3/1997 | Takahashi | ............... | 355/53 |
| 5,715,039 A | 2/1998 | Fukuda et al. | ............... | 355/53 |
| 5,825,043 A * | 10/1998 | Suwa | ............... | 250/548 |
| 5,900,354 A | 5/1999 | Batchelder | ............... | 430/395 |
| 6,191,429 B1 | 2/2001 | Suwa | ............... | 250/548 |
| 6,236,634 B1 | 5/2001 | Lee et al. | ............... | 369/112 |
| 6,560,032 B2 | 5/2003 | Hatano | ............... | 359/656 |
| 6,600,547 B2 | 7/2003 | Watson et al. | | |
| 6,603,130 B1 | 8/2003 | Bisschops et al. | ............... | 250/492.1 |
| 6,633,365 B2 | 10/2003 | Suenaga | ............... | 355/53 |

(Continued)

FOREIGN PATENT DOCUMENTS

DE      206 607      2/1984

(Continued)

OTHER PUBLICATIONS

M. Switkes et al., "Immersion Lithography at 157 nm", MIT. Lincoln Lab, Orlando 2001-1, Dec. 17, 2001.

(Continued)

*Primary Examiner*—Henry Hung Nguyen
(74) *Attorney, Agent, or Firm*—Pillsbury Winthrop Shaw Pittman LLP (57) ABSTRACT

A lithographic apparatus for immersion lithography is described in which a compensation controller controls actuators to apply forces to the substrate equal in magnitude and opposite in direction to forces which are applied to the substrate by a liquid supply system which supplies liquid between the projection system and the substrate.

28 Claims, 3 Drawing Sheets

U.S. PATENT DOCUMENTS

| | | | |
|---|---|---|---|
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0119954 A1 | 6/2004 | Kawashima et al. | 355/30 |
| 2004/0125351 A1 | 7/2004 | Krautschik et al. | 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 834 773 A2 | 4/1998 |
| EP | 0 834 773 A3 | 7/1999 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Dept-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, $\kappa_3$ coefficient in nonparaxial λ/NA scaling equations for resolution, depth of focus, and immersion lithography, J. Microlith., Microfab., Microsyst. 1(1):7-12 (2002).

European Search Report, for European Application No. 05251708.3, dated Jun. 30, 2005.

* cited by examiner

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
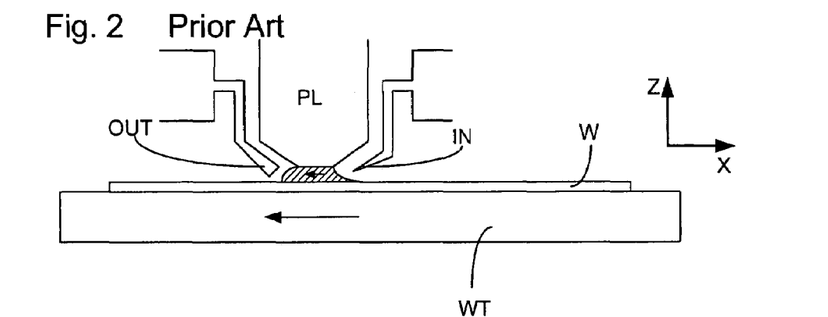
FIG. 2 illustrates, in cross-section, a liquid supply system which may be used with the present invention.
Figure 3:
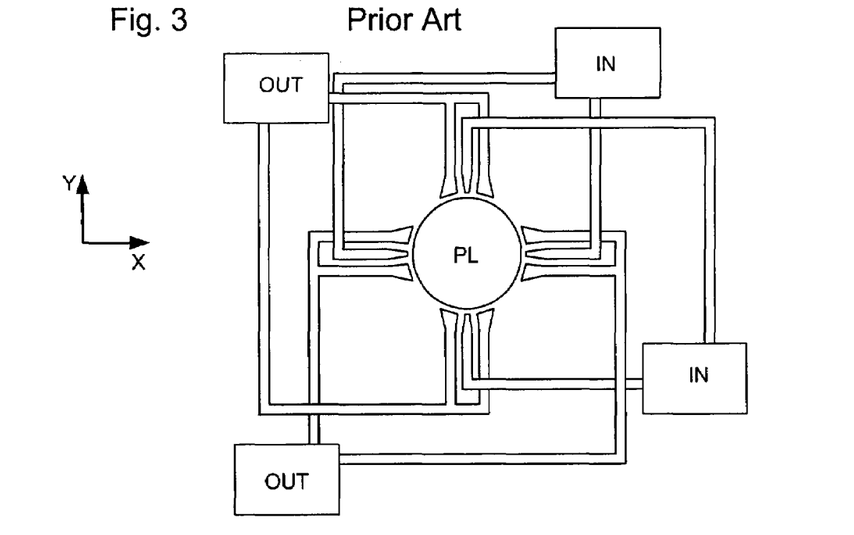
FIG. 3 illustrates the liquid supply system of FIG. 2 in plan.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

It would be advantageous, for example, to provide improved through-put, improved overlay and/or improved critical dimension performance of an immersion lithography apparatus.

According to an aspect, there is provided a lithographic apparatus comprising:

an illumination system configured to provide a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate;

a liquid supply system configured to provide an immersion liquid between the projection system and the substrate table;

an actuator configured to apply a force to the substrate; and a compensation controller configured to determine a compensating force to be applied by the actuator to the substrate to be substantially equal in magnitude and substantially opposite in direction to a force applied to the substrate by the liquid supply system.

Any one or more disturbance forces applied to the substrate that are transmitted by or caused by the liquid supply system may be compensated so as not to affect the position of the substrate. Any source of such disturbance force can be compensated in this way. Examples include force applied to the substrate by the liquid supply system due to gravity, due to variations in pressure in the immersion liquid and due to variations in pressure of liquid and/or gas being removed at a seal or bearing between the barrier member and the substrate or substrate table. Forces from or caused by any one or combination of these sources may be compensated for by the compensation controller.

If the liquid supply system comprises a barrier member which is positioned in a direction substantially parallel to the optical axis of the projection system using a barrier actuator, the compensation controller may be configured to determine the required compensation force based on the force needed by the barrier actuator to keep the barrier member steady or by a signal given by a force sensor between the barrier member and the projection system.

In an embodiment, the compensation controller is configured to determine the compensation force in a feed-forward manner. For example, the compensation controller may determine the compensation force based on a desired position of the substrate. This may be done from a determination of the force of gravity on the liquid supply system, particularly in the case of a localized area liquid supply system (e.g., having a barrier member) where the components of the liquid supply system may remain stationary in a plane orthogonal to the optical axis of the projection system. In such a case, the position, relative to the center of gravity of the substrate table, at which force from the liquid supply system is transmitted to the substrate, varies with the position of the substrate table. This can lead to rotational torques in the plane orthogonal to the optical axis which, if not, compensated for by the compensation controller, could lead to a reduction in imaging performance of the apparatus, particularly imaging and overlay.

There may be other occasions when the liquid supply system exerts a force on the substrate table directly without exerting the same force on the substrate. In such circumstances the compensation controller may be configured to control the actuator to apply compensating force on the substrate table substantially equal in magnitude and opposite in direction to the force applied to the substrate table by the immersion liquid supply system.

The apparatus may further comprise a pressure sensor configured to measure the pressure in the immersion liquid and/or gas and/or liquid pressure in a seal or bearing. This is particularly useful if the compensation controller determines the compensating force based on variations in pressure in the immersion liquid (e.g., in the space) or in the seal or bearing.

According to a further aspect, there is provided a device manufacturing method comprising:

projecting a patterned beam of radiation through an immersion liquid onto a target portion of a substrate using a projection system; and determining and applying a compensating force on the substrate substantially equal in magnitude and opposite in direction to force applied to the substrate by a liquid supply system providing the immersion liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
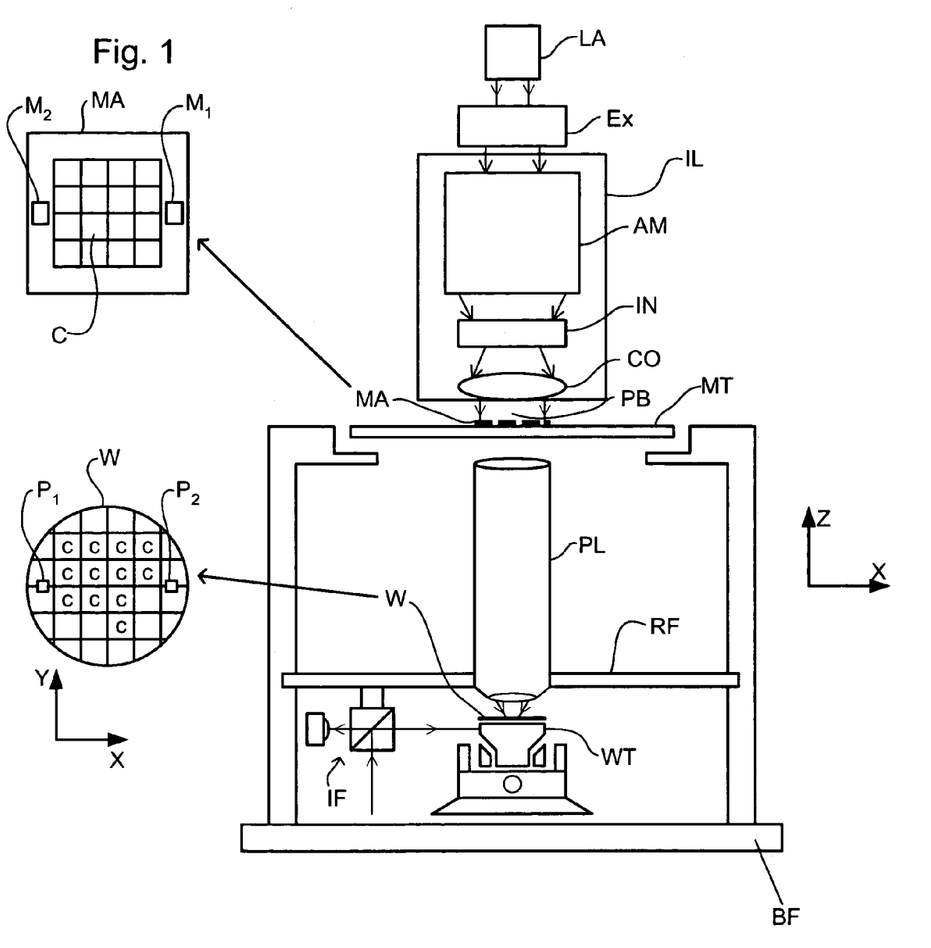
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation or).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

One or more embodiments of the present invention concern measures which can be taken to reduce the disturbance forces introduced by the supply of liquid between the projection system and the substrate in immersion lithography, e.g., reduction of disturbance forces which may be transmitted to the substrate by a liquid supply system. Embodiments of the present invention are applicable to any type of liquid supply system, in particular localized area liquid supply systems which supply liquid to only a localized area of the substrate (compared with, e.g., a bath in which the substrate and perhaps substrate table are immersed).

Figure 4:
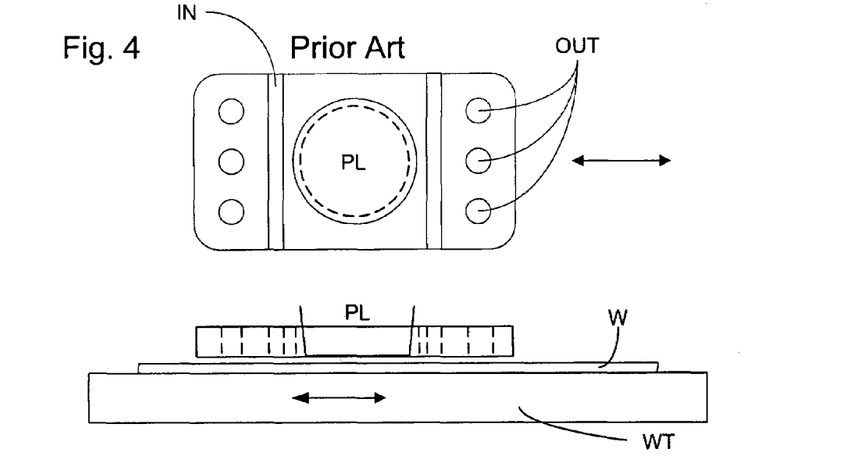
FIG. 4 illustrates, in plan and in cross-section, another liquid supply system which may be used in the present invention.

FIGS. 2 and 3 illustrate a liquid supply system supported in the Z direction by a base frame BF or a metrology reference frame RF (which is supported by but isolated from the base frame). FIG. 4 illustrates a liquid supply system using a barrier member which has an orifice in which a final element of the projection system PL is situated. Thus, the barrier member at least partly surrounds the final element of the projection system PL and forms a space for immersion liquid between the final element of the projection system PL and the substrate W. This type of liquid supply system can either have its weight supported by the projection system PL, by the base frame BF or any other frame or may support its weight through a hydro-static, hydro-dynamic or gas bearing on the substrate W.

A further generic type of liquid confinement system comprises a barrier member which at least partly surrounds a bottom portion of the projection system and forms a space, defined by the substrate, the barrier member and the bottom portion of the projection system PL, to which liquid is supplied. Such a liquid supply system is disclosed in, for example, European Patent application nos. 03257070.7 and 03256643.2, both of which are hereby incorporated in their entirety by reference. In an embodiment, the weight of the barrier member is supported on the substrate W and/or the substrate table WT by a gas bearing, e.g., provided on the under side of the barrier member. The barrier member is connected to the base frame BF but only substantially to prevent movement in the XY plane. Alternatively, a similar barrier member may be used in which hydrostatic pressure is used to support the barrier member on the substrate W and/or the substrate table WT. Such a system is disclosed in European Patent application no. 03254078.3, hereby incorporated in its entirety by reference. A further variation of the barrier member is disclosed in U.S. patent application Ser. No. 10/743,271, filed Dec. 23, 2003, hereby incorporated in its entirety by reference.

The materials of which the above mentioned liquid supply systems are constructed, and in particular barrier members, are chosen so that they have no adverse effects on contact with the immersion liquid (e.g. corrosion), they do not deteriorate the quality of the immersion liquid e.g. by dissolving in the immersion liquid, and they are compatible with all other requirements related to lithography that are not specific to immersion. Typical examples include austenitic stainless steels (e.g. the AISI 300 series and equivalents), nickel and nickel-based alloys, cobalt and cobalt-based alloys, chromium and chromium-based alloys, titanium and titanium-based alloys. However, in order to prevent galvanic corrosion, it is best to avoid combinations of several different metals in the design. Polymers may also be used and suitable polymers include many fluorine-based polymers (e.g. PTFE (Teflon (RTM)), PFA and PVDF) also, uncolored PE and PP could be used as well as all ceramic materials, with the exception of aluminum nitride. Ceramic-based composite materials may also be suitable as may be glasses (e.g. fused silica or quartz glass) and low thermal expansion glasses or glass ceramics (e.g. ULE8 (TM) from Corning or Zerodur (TM) from Schott).

Disturbance forces which might be transmitted to the substrate W include forces due to gravity (for those liquid supply systems which are at least in part supported by the substrate) and the effect of immersion liquid pressure on the substrate W (for all types of liquid supply system). Other disturbance forces are, for example, from liquid or gas bearings or seals operating between the liquid supply system and substrate W and/or substrate table WT (e.g., gas bearings or gas seals on the underside of a barrier member) or due to activated movements in the Z, Rz, Rx and Ry directions of the liquid supply system. In some circumstances, the bearing or seal removes liquid and/or gas from the liquid supply system. The pressure of the liquid and/or gas can vary and cause disturbance forces to be transmitted to the substrate table WT.

Figure 5:
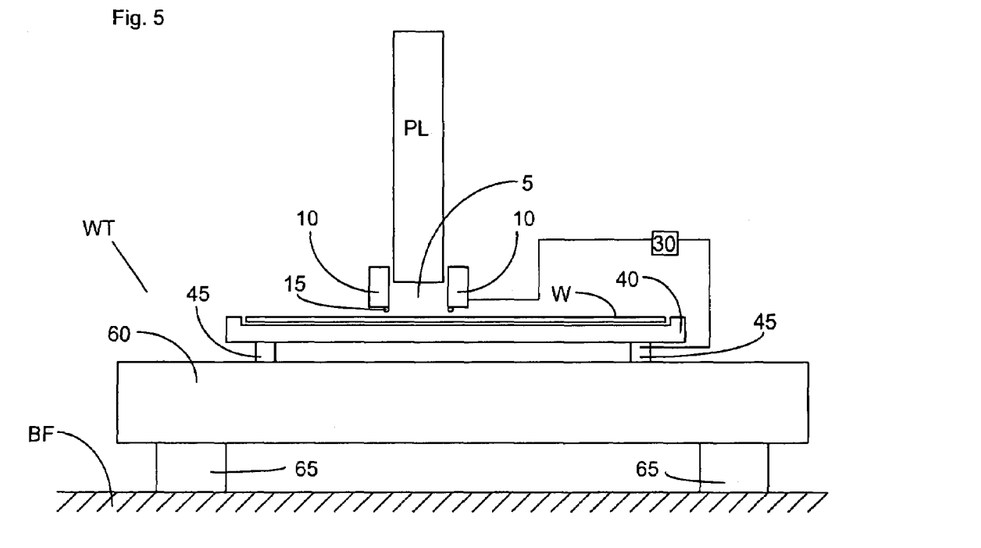
FIG. 5 illustrates, in cross-section, a substrate table and liquid supply system according to an embodiment of the present invention.

An embodiment of the substrate table WT assembly is illustrated in FIG. 5. What is illustrated in FIG. 5 is an example only and the substrate table WT may have a different construction. The principles explained in relation to FIG. 5 (and FIGS. 6 and 7) are equally applicable to other types of substrate table WT as well as, of course, other types of liquid supply system.

In FIG. 5, a liquid supply system with a barrier member 10 is illustrated. A gas seal 15 seals between the bottom of the barrier member 10 and the substrate W and/or substrate table WT. The barrier member 10 provides a space 5 which can be filled with immersion liquid so that the space between the projection system PL, the substrate W and bounded by the barrier member 10 is filled with immersion liquid. The apparatus includes a compensation controller for controlling one or more actuators 45 to apply a compensating force on the substrate W substantially equal in magnitude and opposite in direction to force applied to the substrate by the liquid supply system.

The substrate table WT is comprised of two main parts 40, 60. The upper main part 40 is designed for accurate fine positioning of the substrate W, which is carried by the upper main part 40. The lower main part 60 is moved by actuator (s) 65 on a coarse scale, final accurate positioning being achieved by movement of the upper main part 40 by actuator(s) 45 which act between the upper and lower main parts 40, 60. One or more embodiments are described below referring to one or more actuators 45 between the upper and lower main parts of the substrate table 40, 60 but of course is equally applicable to other substrate tables such as those types that only have one part or indeed those types that have more than two parts. While described in relation to one or more actuators 45 being the main fine three dimensional positioning actuators, separate actuators may be specifically provided for applying the compensating forces required. These compensating forces may even be applied directly to the substrate W or could indeed be applied by the actuator(s) 65 for the main lower part of the substrate table WT.

Both actuators 45, 65 are capable of moving their respective parts of the substrate table 40, 60 in the XY plane and, to a more limited extent, in the Z direction relative to the lower main part 60 and to the base frame BF respectively.

Figure 6:
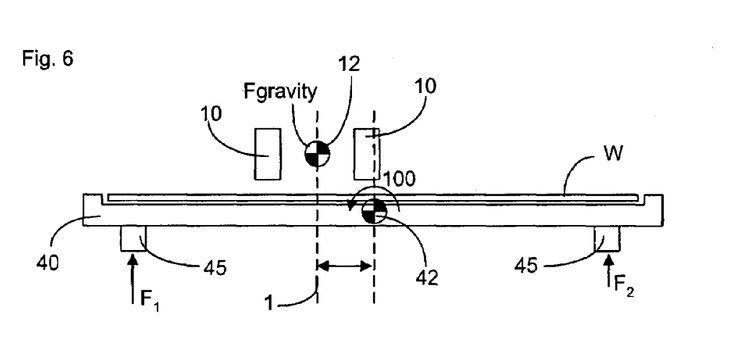
FIG. 6 illustrates the positional dependence of the substrate table on the compensation force needed according to an embodiment of the present invention.

FIG. 6 illustrates how an embodiment of the present invention uses the compensation controller 30 to determine the necessary compensation force and to control the actuator (s) 45 to compensate for the effect of gravity of the barrier member 10 on the substrate W in the case where the barrier member 10 is supported by the substrate W (for example through a hydrostatic, hydrodynamic or gas bearing). The determinations preferably account for Rx, Ry and Rz rotational movements as well as Z movements. The same principles can be applied when considering the effects of disturbance forces transmitted through the immersion liquid and which will be described in more detail in relation to FIG. 7. In both cases, the forces applied to the substrate table W may be estimated as being through the center of gravity of the barrier member 10 or the center of the area of the substrate WT covered by immersion liquid from the liquid supply system. The determinations by the compensation controller 30 may be made, for example, by calculation, table look-up or any other means. The compensation controller 30 may be, for example, mechanical, electronic and/or software based.

FIG. 6 illustrates a 3-dimensional problem in two dimensions. Although the weight of the barrier member 10 is constant, as can be seen from FIG. 6, when the center of the substrate W moves away from directly underneath the optical axis of the projection system (indicated as dotted line 1) a moment 100 around the center of gravity of the upper part of the substrate table 40 is generated. In the case illustrated in FIG. 6 this requires a larger compensating force $F_1$ to be applied on the left hand actuator 45 than the compensating force $F_2$ applied to the right hand actuator 45. The actuators 45 must apply a force to support both the upper part 40 of the substrate table and the barrier member. If the substrate table WT were moved to the right, the force on the left hand actuator $F_1$ would increase and the force on the right hand actuator $F_2$ would need to reduce. Thus, it can be seen that the compensation controller can determine the compensating force based on a desired position of the substrate W and control the actuator 45 accordingly. The determination can also be carried out using the actual X, Y position as this is usually only a few nm different to the desired position.

The actuators 45 are controlled to apply compensating force on the substrate table substantially equal in magnitude and opposite in direction to the force applied to the substrate by the liquid supply system.

It is also possible that the liquid supply system applies forces to the substrate table WT directly and not through the substrate. In this case the same principles apply and the compensation controller can compensate for any disturbances caused in this way.

The compensation controller 30 can determine the compensation force in a feed-forward manner by being fed the desired (or actual) co-ordinates of the substrate W. From this information the combined center of gravity of the upper part of the substrate table 40 and of the barrier member 10 can be determined from a knowledge of their positions and masses and the force applied to actuator 45 as appropriate. Clearly the determinations can be based on any point in space. The determinations can be carried out from a knowledge of the mass of the barrier member 10 and its position as well as the mass of the upper part 40 of the substrate table, including the substrate W.

Figure 7:
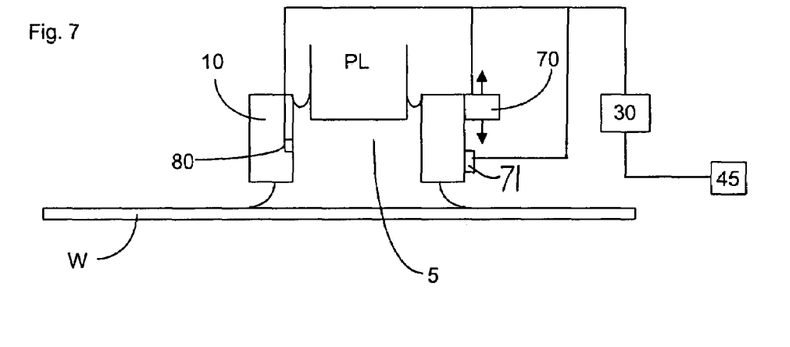
FIG. 7 illustrates two possible ways of establishing the compensation force needed according to an embodiment of the present invention.

Referring to FIG. 7, the compensation controller 30 can additionally or alternatively determine a compensation force required due to pressure of the liquid and/or gas in a seal or bearing or pressure of liquid in the space. The pressures can be measured and the determination performed in a feed forward or feed back manner. For this purpose a pressure sensor 80 is provided or data from a force sensor 71 can be used. Alternatively, the pressure can be determined from, for example, a knowledge of the flow rate of liquid into and/or out of the space 5. In this way the inherent variations in pressure of the immersion liquid in the space 5 due to extraction of gas/liquid mixture can be compensated.

In an embodiment, a compensation force component is added to the overall force signal generated for each of the actuators 45. The other components include that for positioning of the substrate W as well as that for compensating the force of gravity on the upper part 40.

It will be appreciated that similar compensation forces to those generated by upper actuators 45 may need to be generated by lower actuators 65 in that the forces on the lower part 60 are balanced.

If the barrier member 10 is partly supported by another part of the apparatus other than the substrate W or substrate table WT, and is actuated in the Z direction by an actuator 70, it is possible to measure the force on the substrate W or substrate table WT from a knowledge of the force applied by the actuator 70. The actuator 70 may be a electromagnetic motor, a piezoelectric motor, a gas, hydrodynamic or hydrostatic bearing between the barrier member 10 and the substrate W and/or substrate table WT, or any other sort of actuator. Information about the forces applied by the actuators can be used to determine the force on the substrate W and used (in a feed-forward manner) to determine the compensation force required. Element 71 is a force sensor which outputs a signal representing the force between the barrier member and the projection system which can be used by the compensation controller to determine the required compensation force. Force sensor 71 may be used with or without actuator 70.

The compensation force may be filtered (and thereby corrected) for certain dynamic properties of the liquid supply system, for example dynamic properties of the barrier member 10 (such as bending for example) and possible seal/bearing characteristics (such as elasticity).

The compensation controller may also determine the compensation force in a feedback manner based on any variable other than the position of the table. For example the feedback determination may be on the basis of the force sensor 70 output or the actuator force or the pressure of the liquid in the space and/or pressure of liquid and/or gas at the seal and/or bearing.

As stated above, the pressure of liquid in space 5, seal and/or bearing can apply a force (pressure times area) to the substrate W or substrate table WT. The moment applied to the upper part of the substrate table 40 by the immersion liquid is also positionally dependent and the force can be determined from a knowledge of the pressure of immersion liquid in the space 5 and the surface area over which that pressure is applied.

Another immersion lithography solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such a system is disclosed in, for example, U.S. patent application Ser. No. 10/705,783, hereby incorporated in its entirety by reference.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application no. 03257072.3, hereby incorporated in its entirety by reference, the idea of a twin or dual stage immersion lithography apparatus is disclosed. Such an apparatus is provided with two substrate tables for supporting the substrate. Leveling measurements are carried out with a substrate table at a first position, without immersion liquid, and exposure is carried out with a substrate table at a second position, where immersion liquid is present. Alternatively, the apparatus can have only one substrate table moving between the first and second positions.

The present invention can be applied to any immersion lithography apparatus, in particular, but not exclusively, to those types mentioned above.

While specific embodiments of the invention have been described above, it will be appreciated that the invention may be practiced otherwise than as described. The description is not intended to limit the invention.

The invention claimed is:

1. A lithographic apparatus comprising:
an illumination system configured to provide a beam of radiation;

a support structure configured to hold a patterning device, the patterning device configured to impart the beam with a pattern in its cross-section;
a substrate table configured to hold a substrate;
a projection system configured to project the patterned beam onto a target portion of the substrate;
a liquid supply system configured to provide an immersion liquid between the projection system and the substrate table;
an actuator configured to apply a force to the substrate; and
a compensation controller configured to determine a compensating force to be applied by the actuator to the substrate to be substantially equal in magnitude and substantially opposite in direction to a force applied to the substrate by the liquid supply system.

2. Apparatus according to claim 1, wherein the compensation controller is configured to determine the compensation force in a feed-forward manner.

3. Apparatus according to claim 1, wherein the compensation controller is configured to determine the compensation force in a feedback manner.

4. Apparatus according to claim 1, wherein the compensation controller is configured to determine a compensation force that is filtered and corrected for dynamic properties of the liquid supply system.

5. Apparatus according to claim 1, wherein the compensation controller is configured to determine the compensation force based on an actual or a desired position of the substrate.

6. Apparatus according to claim 1, wherein the compensation controller is configured to control the actuator to apply a compensating force on the substrate table substantially equal in magnitude and substantially opposite in direction to a force applied to the substrate table by the liquid supply system.

7. Apparatus according to claim 1, wherein the compensation controller is configured to determine the compensation force based on a force applied to the substrate by the liquid supply system due to gravity.

8. Apparatus according to claim 1, wherein the liquid supply system comprises a barrier member at least partly surrounding the projection system to define a space between the projection system and the substrate to be at least partially filled with an immersion liquid.

9. Apparatus according to claim 8, wherein the barrier member is at least partly supported by the substrate, the substrate table, or both.

10. Apparatus according to claim 8, comprising a barrier actuator configured to position the barrier member in a direction substantially parallel to the optical axis of the projection system.

11. Apparatus according to claim 10, wherein the barrier actuator is a gas bearing, a hydrodynamic bearing or a hydrostatic bearing.

12. Apparatus according to claim 10, wherein the compensation controller is configured to determine the compensating force based on the force needed by the barrier actuator to keep the barrier member steady.

13. Apparatus according to claim 1, wherein the compensation controller is configured to determine the compensating force based on variations in pressure in the immersion liquid or variations in pressure of liquid or gas in a bearing or seal of the liquid supply system.

14. Apparatus according to claim 13, further comprising a pressure sensor configured to measure the pressure in the immersion liquid, in a seal or in a bearing, a force sensor configured to measure a force between the liquid supply system and the projection system, or both.

15. Apparatus according to claim 1, wherein the actuator is configured to apply force to at least part of the substrate table which supports the substate.

16. Apparatus according to claim 15, wherein the compensation controller is configured to determine the compensating force based on the desired or actual position of the center of gravity of the part of the substrate table supporting the substrate relative to the projection system.

17. Apparatus according to claim 1, wherein the compensation controller is configured to apply a compensating force on the substrate in a direction substatially parrallel to the optical axis of the projection system, and rotationally about axes substantially orthogonal to the optical axis of the projection system.

18. A device manufacturing method comprising:
projecting a patterned beam of radiation through an immersion liquid onto a target portion of a substrate using a projection system; and
determining and applying a compensating force on the substrate substantially equal in magnitude and opposite in direction to force applied to the substrated by a liquid supply system providing the immersion liquid.

19. The method according to claim 18, wherein the compensation force is determined in a feed-forward manner.

20. The method according to claim 18, wherein the compensation force is determined in a feedback manner.

21. The method according to claim 18, wherein the compensation force is determined based on the actual or a desired position of the substate.

22. The method according to claim 18, wherein the compensation force is determined based on force applied to the substate by the liquid supply system due to gravity.

23. The method according to claim 18, wherein the compensating force is determined based on variations in pressure in the immersion liquid.

24. The method according to claim 18, wherein the compensating force is determined based on variations in pressure in a seal, bearing or both.

25. The method according to claim 18, wherein the compensating force is determined based on a force needed by an actuator to keep a barrier member steady, the barrier member at least partly defining a space between the projection system and the substrate which is at least partially filled with the immersion liquid.

26. The method according to claim 18, wherein the compensating force is determined based on a force between the liquid supply system and the projection system.

27. The method according to claim 18, wherein the compensating force is determined based on a desired or actual position of the center of gravity of at least part of a substrate table supporting the substrate relative to the projection system.

28. The method according to claim 18, wherein the compensation force is applied on the substate in a direction substantially parallel to the optical axis of the projection system, and rotationally about axes substantially orthogonal to the optical axis of the projection system.

* * * * *